United States Patent
Cordero et al.

(10) Patent No.: US 8,869,007 B2
(45) Date of Patent: Oct. 21, 2014

(54) THREE DIMENSIONAL (3D) MEMORY DEVICE SPARING

(75) Inventors: Edgar R. Cordero, Round Rock, TX (US); Anil B. Lingambudi, Karnataka (IN); Saravanan Sethuraman, Bangalore (IN); Kenneth L. Wright, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 13/523,091

(22) Filed: Jun. 14, 2012

(65) Prior Publication Data

US 2013/0339820 A1 Dec. 19, 2013

(51) Int. Cl.
 G11C 29/00 (2006.01)
 G06F 11/10 (2006.01)
 G11C 29/44 (2006.01)
 H03M 13/05 (2006.01)

(52) U.S. Cl.
 CPC ........ G06F 11/1072 (2013.01); G11C 29/4401 (2013.01); H03M 13/05 (2013.01); G06F 11/1048 (2013.01)
 USPC .......................................... 714/773; 714/711

(58) Field of Classification Search
 None
 See application file for complete search history.

(56) References Cited

U.S. PATENT DOCUMENTS

| | | | |
|---|---|---|---|
| 5,414,637 A | 5/1995 | Bertin et al. | |
| 5,946,545 A | 8/1999 | Bertin et al. | |
| 6,512,708 B1 | 1/2003 | Hsuan et al. | |
| 6,573,524 B2 | 6/2003 | Ho | |
| 7,379,316 B2 | 5/2008 | Rajan | |
| 7,477,522 B2* | 1/2009 | Hazelzet | 361/760 |
| 7,599,205 B2* | 10/2009 | Rajan | 365/63 |
| 7,796,446 B2 | 9/2010 | Ruckerbauer et al. | |
| 7,870,459 B2* | 1/2011 | Hazelzet | 714/753 |
| 7,929,368 B2 | 4/2011 | Jeddeloh | |
| 7,936,622 B2 | 5/2011 | Li et al. | |
| 7,944,047 B2 | 5/2011 | Oh et al. | |
| 7,984,355 B2* | 7/2011 | Djordjevic | 714/746 |
| 8,032,804 B2 | 10/2011 | Jeddeloh | |
| 8,040,745 B2 | 10/2011 | Shibata | |
| 8,060,774 B2 | 11/2011 | Smith et al. | |
| 8,063,491 B2 | 11/2011 | Hargan | |
| 8,750,010 B2* | 6/2014 | Hofstra | 365/51 |
| 2007/0058410 A1* | 3/2007 | Rajan | 365/63 |
| 2007/0058471 A1* | 3/2007 | Rajan et al. | 365/222 |
| 2010/0110745 A1 | 5/2010 | Jeddeloh et al. | |
| 2011/0169522 A1 | 7/2011 | Raj et al. | |
| 2012/0185753 A1 | 7/2012 | Chen et al. | |
| 2013/0275823 A1* | 10/2013 | Cordero et al. | 714/718 |
| 2013/0294140 A1 | 11/2013 | Oh et al. | |
| 2013/0294184 A1 | 11/2013 | Yang et al. | |

\* cited by examiner

*Primary Examiner* — Daniel McMahon
(74) *Attorney, Agent, or Firm* — Cantor Colburn LLP (57) ABSTRACT

According to one embodiment of the present invention, a method for operating a three dimensional ("3D") memory device includes detecting, by a memory controller, a first error on the 3D memory device and detecting, by the memory controller, a second error in a first chip in a first rank of the 3D memory device, wherein the first chip has an associated first chip select. The method also includes powering up a second chip in a second rank, sending a command from the memory controller to the 3D memory device to replace the first chip in the first chip select with the second chip and correcting the first error using an error control code.

20 Claims, 6 Drawing Sheets

THREE DIMENSIONAL (3D) MEMORY DEVICE SPARING

BACKGROUND

The present invention relates generally to computer memory, and more particularly to providing sparing for a memory system.

Computer systems often require a considerable amount of high speed random access memory (RAM) to hold information, such as data and programs, temporarily when a computer is powered and operational. This information is normally binary, composed of patterns of 1's and 0's known as bits of data. The bits of data are often grouped and organized at a higher level. A byte, for example, is typically composed of eight bits; more generally these groups or bytes are called symbols and may consist of any number of bits or sub-symbols.

Memory device densities have continued to grow as computer systems have become more powerful. Currently it is not uncommon to have the RAM content of a single computer be composed of hundreds of trillions of bits. Unfortunately, the failure of just a portion of a single RAM device can cause the entire computer system to fail. When memory errors occur, which may be "hard" (repeating) or "soft" (one-time or intermittent) failures, these failures may occur as single cell, multi-bit, full chip or full memory module failures and all or part of the system RAM may be unusable until it is repaired. Repair turn-around-times can be hours or even days, which can have a substantial impact to a business dependent on the computer systems.

The probability of encountering a RAM failure during normal operations has continued to increase as the amount of memory storage in contemporary computers continues to grow.

Techniques to detect and correct bit errors have evolved into an elaborate science over the past several decades. These error detection and error correction techniques are commonly used to restore data to its original/correct form in noisy communication transmission media or for storage media where there is a finite probability of data errors due to the physical characteristics of the device. Memory devices generally store data as voltage levels representing a 1 or a 0 in RAM and are subject to both device failure and state changes due to high energy cosmic rays and alpha particles.

A group of memory chips or dies in a memory device (e.g., dynamic random-access memory or DRAM), referred to as a rank, are positioned adjacent one another on a layer of the memory device. In some cases, a single memory error may be identified and corrected by code in the memory system, while multiple errors or failures at a selected point in time may not be identified and corrected, as error correction systems are unable to detect more than two errors at a time. Accordingly, in some cases when one or more chips of the rank fail or experience an error, the entire rank is taken offline or disabled to prevent the memory failures in that rank from adversely affecting system performance.

SUMMARY

According to one embodiment of the present invention, a method for operating a three dimensional ("3D") memory device includes detecting, by a memory controller, a first error on the 3D memory device and detecting, by the memory controller, a second error in a first chip in a first rank of the 3D memory device, wherein the first chip has an associated first chip select. The method also includes powering up a second chip in a second rank, sending a command from the memory controller to the 3D memory device to replace the first chip in the first chip select with the second chip and correcting the first error using an error control code.

According to another embodiment of the present invention, a computer program product for operating a 3D memory device includes a tangible storage medium readable by a processing circuit and storing instructions for execution by the processing circuit for performing a method. The method includes detecting a first error on in the 3D memory device, detecting a second error in a first chip in a first rank of the 3D memory device, wherein the first chip has an associated first chip select and powering up a second chip in a second rank. The method also includes sending a command from a memory controller to the 3D memory device to replace the first chip in the first chip select with the second chip and correcting the first error using an error control code.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

An embodiment is directed to configuring memory chips in a stack of chip layers that form a three dimensional (3D) memory device. In an embodiment, a logic, system and/or method is used to control the use of chips in the 3D memory device. Embodiments may perform such tasks as rank sparing control, chip select remapping and powering down by a suitable technique utilizing software, hardware and/or firmware. An exemplary system uses per dynamic random access memory (DRAM) addressability (PDA) in order to specify mode register set (MRS) commands to individual chips within a rank or traditional MRS commands to address all chips of ranks simultaneously. In an embodiment, the stack of chips are coupled and/or connected using suitable conductors, such as through silicon vias (TSV). A master logic portion, layer or chip may be used to control chips on other layers or ranks of the memory device, where chips in the other layers are referred to as slave chips. In an embodiment, the MRS commands sent to the TSV stack of chips tell the master logic as well as the slave chips which chips to enable and disable as well as sparring or chip select mapping that is desired.

In one embodiment, a TSV stack has five layers of chips or ranks. Associated with four of the five ranks are four addressable chip selects. Each of these chip selects communicates with one or more configured or default chip. The fifth rank or chip layer (also called "die") is used as a spare and does not have an associated chip select that is addressable by a memory controller. In an example, this spare rank, since it is not being actively used, can be placed in a low power mode. In an embodiment, if an error is detected on one of the non-spare chips having associated chip selects (i.e., chips in the ranks other than the spare rank), the memory controller can invoke the spare chip. The spare chip is then powered up and ready to be activated. In an embodiment, the entire spare rank is powered up for use. The memory controller would then send MRS commands to select the spare chip to take the place of the faulty chip by reassigning the failed chip's chip select to the spare chip. In an embodiment, by using the PDA function of the DDR4 memory, only the target stack is sent the MRS commands and the other TSV stacks are not affected. In embodiments, the PDA addressability provides the ability to direct commands that can address each chip in the stack separately, by which a failed chip in the target stack can be identified to swap with a spare chip. Once the failed chip has been replaced by the spare chip, it can then be then put in a low power mode in order to conserve power.

In another embodiment, a TSV 3D memory device has no spare chips or ranks. For example, four layers of chips make up the TSV stack of the 3D memory device. In this case, all of the ranks are assigned to a chip select and all are being actively used by the system. If there is an issue (e.g., failure or error) with one or more chip in a rank in the TSV stack, that rank may be taken offline for fear of data corruption or excessive errors with continued use of the rank. For example, the rank may be de-configured due to repeated errors or multiple errors in the rank. In an example where a second chip in the rank of the same chip select in this stack is properly functioning may then redeployed as a spare chip. This is because the second chip will no longer be accessed in the de-configured rank during normal operation.

In one embodiment, an exemplary dual in-line memory module (DIMM) has four ranks. Each TSV component of the DIMM has four chip layers and therefore each chip of the TSV stack is associated with a rank on the DIMM and also a chip select in the system. For example, in a DIMM that includes a system Rank 0 corresponding to a chip which has been assigned chip select 0 in the TSV stack experiences errors that cause Rank 0 to be de-configured in the system. If the errors were not associated with a first chip mapped to chip select 0 of a particular TSV stack, then that first chip could then be redeployed to serve as a spare chip for the 3D memory device. The spare chips may be assigned as the need arises, such as if the DRAM of a chip assigned chip select 2 fails or has errors, in which case the memory controller may then control the master logic chip to invoke the spare chip mapped to chip select 0 and remap it to respond to requests or communications directed to chip select 2.

In one embodiment, the chip sparing can be done in the same manner as multi-purpose register (MPR) patterns are loaded into the DRAM. Bit MRS3 is defined as '0'—normal operation and '1'—dataflow to TSV master logic. In an embodiment, once in the mode of normal operation to TSV master logic, bank address bits A2 and A1 are used to select the sparing and state configuration mode register in the TSV master logic. These registers control which chips are available to be used as opposed to powered off as well as the chip select mapping as selected by the memory controller. One embodiment of the detailed flow of the protocol is shown in an exemplary flow chart described below.

One additional aspect is that once the DRAM has been put in the dataflow mode to TSV, reads can also be performed in order to verify that chosen spares, chip select mapping and power states are in the states desired by the memory controller and that the commands were received correctly. This reading mechanism may also be used to interrogate the TSV stack so as to inquire about the availability of spares or power saving state of DRAM in that stack.

In some cases, codes may be used to detect and correct errors in words communicated to or from the memory device. For example, memory error correction codes (also referred to as "error control codes" or "ECCs") use a combination of parity checks in various bit positions of the data word to allow detection and correction of errors. Every time data words are written into memory, these parity checks are generated and stored with the data. Upon retrieval of the data, a decoder can use the parity bits thus generated together with the data message in order to determine whether there was an error and to proceed with error correction if feasible. In some cases, more than one error may occur at a time, where the ECC is not able to detect and correct all of the errors. Embodiments of the memory system and method for operation of a memory system provide for sparing to enable memory operation after occurrence of errors.

Figure 1:
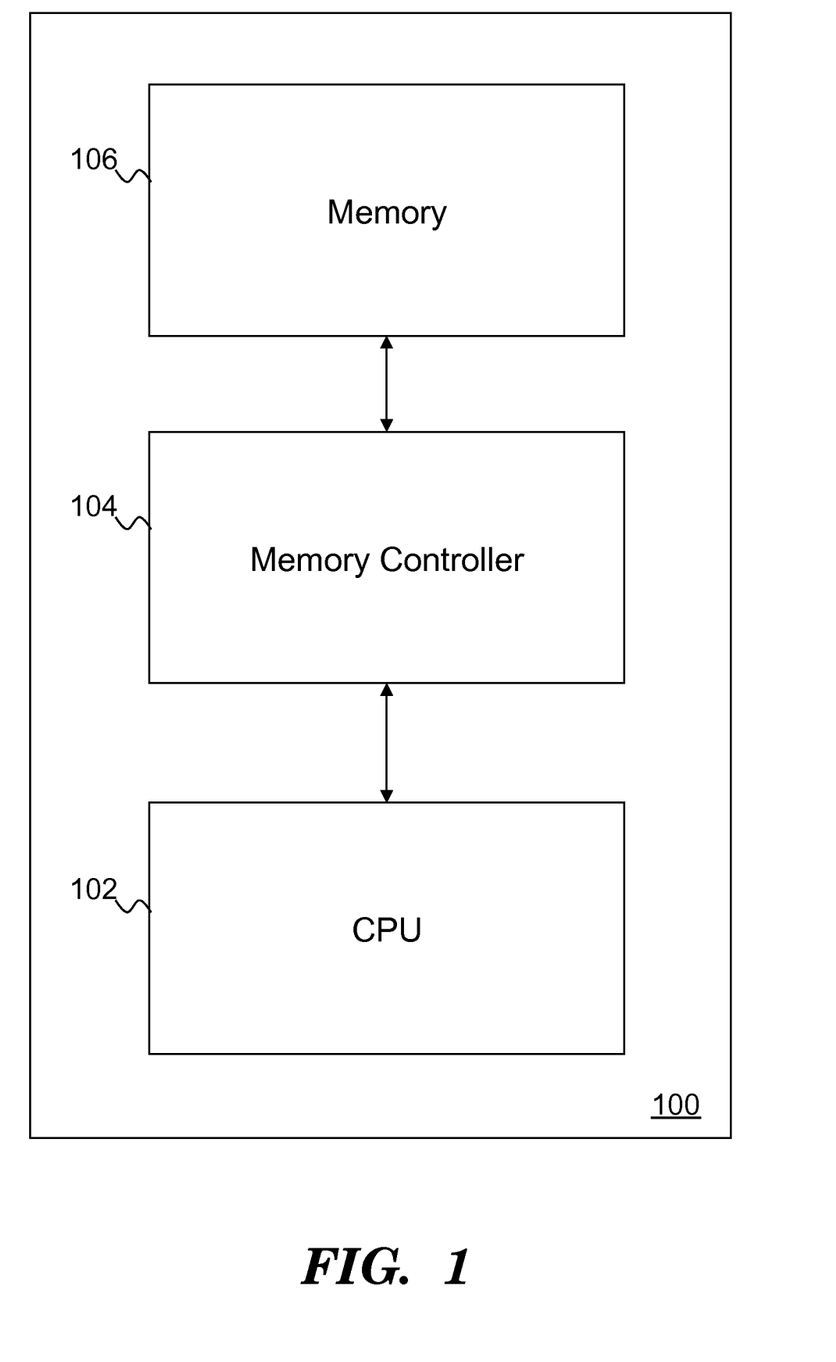
FIG. 1 illustrates a block diagram of a system for storing and retrieving data in a memory in accordance with an embodiment.

FIG. 1 illustrates a block diagram of a system for storing and retrieving data in a memory in accordance with an embodiment. A system 100 depicted in FIG. 1 includes a computer processor 102, a memory 106 having memory cells, and a memory controller 104 for receiving data from the computer processor 102 to be stored in the memory 106. In an embodiment, the memory cells are arranged into pages, and pages are arranged into blocks. Thus, a block may contain a plurality of pages, each page containing a plurality of memory cells.

In one embodiment the memory controller 104 is coupled to the computer processor 102 and receives write requests from the computer processor 102. The write requests contain data to be written to the memory 106 and a logical address for identifying the location in the memory 106 to which the data will be written. The memory controller 104 stores data at a physical address within the memory 106. In an embodiment, the memory controller 104 maps the logic address to a physical address in the memory 106 when storing or retrieving data. The physical address for a given logical address may change each time data in the memory 106 is modified.

The system 100 is one example of a configuration that may be utilized to perform the processing described herein. Although the system 100 has been depicted with only a single memory 106, memory controller 104, and computer processor 102, it will be understood that other embodiments would also operate in other systems with two or more of the memory 106, memory controller 104, or computer processor 102. In an embodiment, the memory 106, memory controller 104, and computer processor 102 are not located within the same computer. For example, the memory 106 and memory controller 104 may be located in one physical location (e.g., on a memory module) while the computer processor 102 is located in another physical location (e.g., the computer processor 102 accesses the memory controller 104 via a network). In addition, portions of the processing described herein may span one or more of the memory 106, memory controller 104, and computer processor 102.

Figure 2:
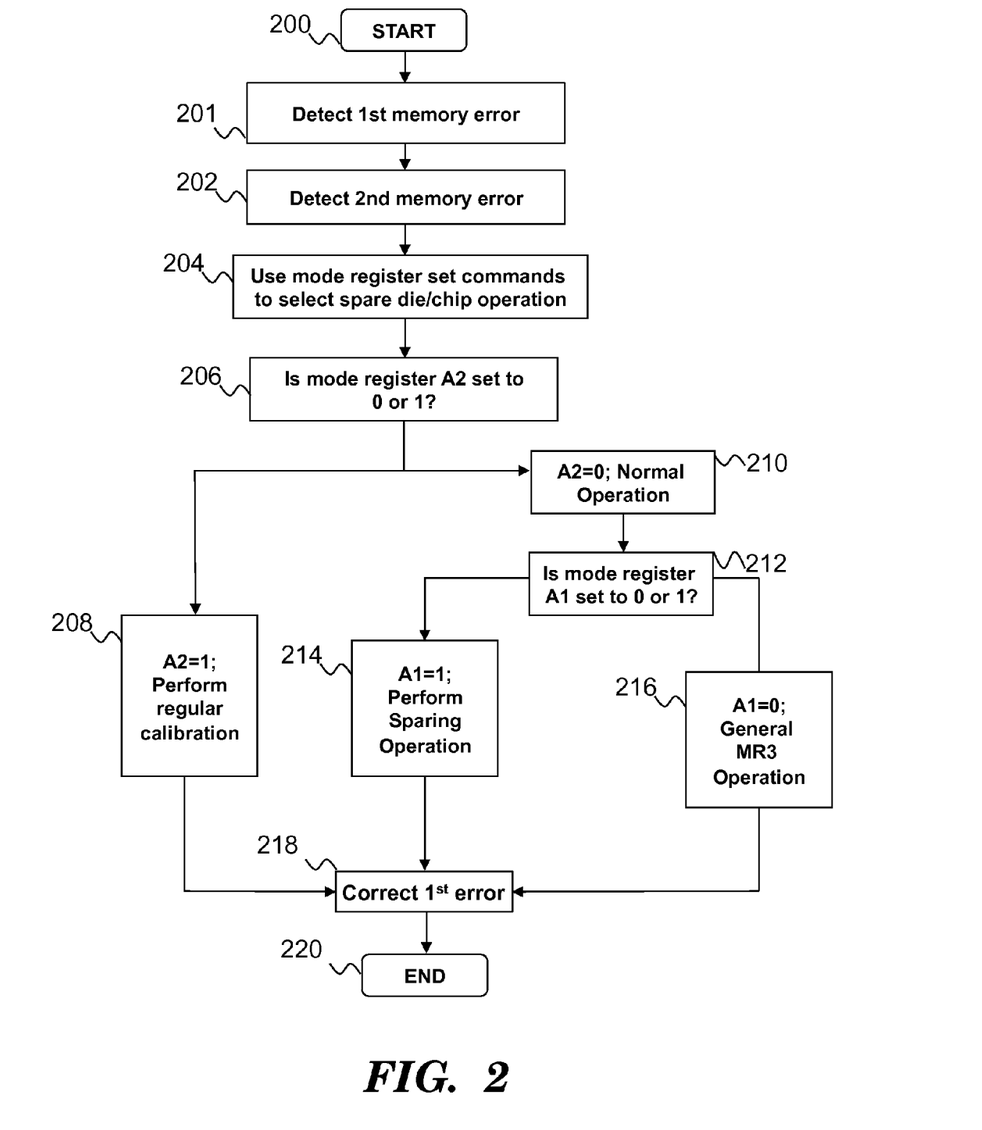
FIG. 2 illustrates a flow diagram of a method for operating a memory system that provides sparing for a memory device in accordance with an embodiment.

FIG. 2 is a flow chart of an exemplary method for operating a memory system that provides sparing of chips in rank of a memory device. The depicted blocks may be part of or in addition to another process and/or may be performed in any suitable order to provide chip sparing for a memory device. In an embodiment, commands for the blocks are performed by a memory controller. In block 200, the method is started, where the memory system is operating and communication with a processor or computing system. In block 201, the memory system detects a first error in the memory device. The error may be corrected as part of block 201 or may be corrected later, as depicted in the chart. In an embodiment, an ECC process may be used to detect and correct the first error. In block 202, a second error is detected in the memory device. The second error may be detected by any suitable method, such as by verifying parity bits and/or ECC. In an embodiment, the second error is detected through a scrub engine that runs in the background. In block 204, mode register set (MRS) commands are used to select the sparing operation for a chip or die of the memory device. In block 206, a value for a selected mode register is determined, where the value indicates if the memory device is in a normal operation mode. For example, the value of mode register A2 in mode register set 3 (MRS3) may either be a 0 or 1 to indicate normal operation or calibration, respectively. In block 208, normal operation and, consequently, sparing is not available as mode register A2 has a value of 1. Further, the value of 1 indicates that a calibration is being performed on the memory device.

In block 210, the value of mode register A2 is 0, thus indicating normal operation of the device. In block 212, the value of mode register A1 is determined to indicate if the sparing operation is enabled. In block 214, the value of A1 is 1, therefore the sparing of chips or die in the memory device is enabled and initiated. In an embodiment, the chip where the second error is detected (block 202) is the failed chip that is fixed by the sparing operation. In block 216, the value of A1 is 0, sparing is disabled and general operation for the mode registers occurs. Sparing may be disabled due to various factors, such as lack of spare chips or the entire chip stack is failed. In block 218, the first error from block 201 is corrected. For example, an ECC method may be used to correct the first error while the sparing operation is used to correct the second error. In block 220, the sparing operation for the memory device is ended.

The exemplary sparing method provides memory operation and memory failure correction for hard and/or soft errors in the memory system, where hard errors are repeating errors and soft errors are intermittent. Further, embodiments provide detection and sparing for the memory device during run time or dynamically (e.g., while the memory system is in use). In addition, embodiments use existing chip architectures, routing and patterns, thus providing sparing without additional routing.

Figure 3:
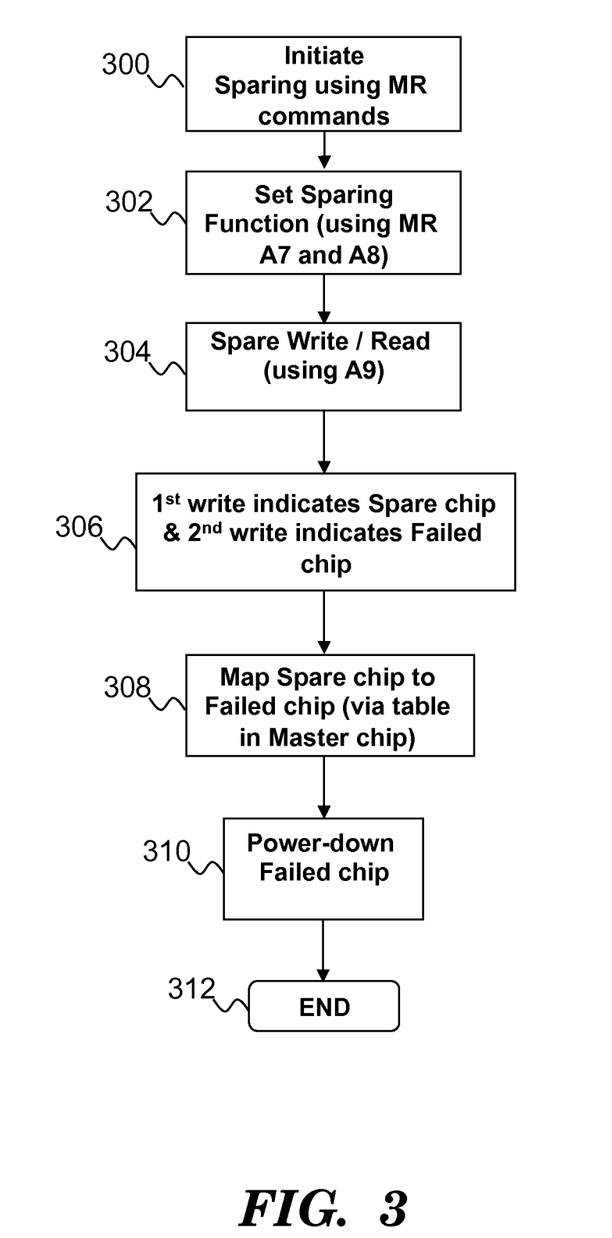
FIG. 3 illustrates a flow diagram of a method for operating a memory system that provides sparing for a memory device in accordance with an embodiment.

FIG. 3 is a flow chart of an exemplary method for sparing of chips in a memory device. The depicted blocks may be part of or in addition to another process and/or may be performed in any suitable order to provide chip sparing for a memory device. For example, the depicted blocks may be performed as part of the block 214 of the memory operation shown in FIG. 2 by a memory controller. In block 300, the sparing operation is initiated using mode register (MR) commands. In an embodiment, the sparing operation is initiated by setting selected values for mode registers A1 and A2 of mode register set 3, as shown in the following table (TABLE 1).

TABLE 1

| A2 | A1 | Description |
|---|---|---|
| 0 | 0 | Normal operation |
| 0 | 1 | Normal operation with Rank sparing |
| 1 | X | Data flow with MPR pattern |

In block 302, the sparing function is set using mode registers A7 and A8 of mode register set 3. Values of A7 and A8 may be used to set the sparing function to normal operation, sparing, power up or power down, as shown in the following table (TABLE 2). In an embodiment, a spare chip is powered up as a step of the sparing operation before it is mapped to replace a failed chip. Further, the failed chip may be powered down after the mapping to reduce power consumption. In an embodiment, the failed chip is powered down after data is copied from the failed chip to the spare chip.

TABLE 2

| A8 | A7 | Sparing function |
|---|---|---|
| 0 | 0 | Normal operation |
| 0 | 1 | Sparing |
| 1 | 0 | Power up |
| 1 | 1 | Power down |

In block 304, the write or read command is set to a value for mode register A9. For example, a value of 0 for A9 is a spare read command and a value of 1 is a spare write command. In block 306, a first write indicates the spare (new) chip and a second write indicates the failed chip having the error, where the failed chip is to be taken offline. In an embodiment, the first write uses a selected number of binary values (e.g. four values to locate the failed/spare chips in the 8 or 16-high stack) to indicate the correct chip select for the spare chip. In addition, the second write uses a selected number of binary values to indicate the failed chip. In block 308, the spare chip is mapped to the failed chip in a master logic chip of the memory system or module. In an embodiment, the mapping is provided by one or more tables in the master chip, wherein the sparing process updates the one or more tables. For example, the table below (TABLE 3) shows values to indicate the spare chip for the blocks. The table is flexible and may be used to map 16 chips in the stack instead of the depicted arrangement with 8-chips in a stack.

TABLE 3

| S3 | S2 | S1 | S0 | Chip Select |
|---|---|---|---|---|
| 0 | 0 | 0 | 0 | Chip 0 |
| 0 | 0 | 0 | 1 | Chip 1 |
| 0 | 0 | 1 | 0 | Chip 2 |
| 0 | 0 | 1 | 1 | Chip 3 |
| 0 | 1 | 0 | 0 | Chip 4 |
| 0 | 1 | 0 | 1 | Chip 5 |
| 0 | 1 | 1 | 0 | Chip 6 |
| 0 | 1 | 1 | 1 | Chip 7 |

In addition, the following exemplary table (TABLE 4) shows values to indicate the failed (or target) chip.

TABLE 4

| T3 | T2 | T1 | T0 | Chip Select |
|----|----|----|----|-------------|
| 0  | 0  | 0  | 0  | Chip 0      |
| 0  | 0  | 0  | 1  | Chip 1      |
| 0  | 0  | 1  | 0  | Chip 2      |
| 0  | 0  | 1  | 1  | Chip 3      |
| 0  | 1  | 0  | 0  | Chip 4      |
| 0  | 1  | 0  | 1  | Chip 5      |
| 0  | 1  | 1  | 0  | Chip 6      |
| 0  | 1  | 1  | 1  | Chip 7      |

Tables 3 and 4 may be expanded to show more ranks, depending on the application. In block 310, the failed chip is powered down by a mode register command, such as a command setting values for A7 and A8 as shown above. In block 312, the sparing operation ends. In embodiments, the sparing process is initiated due to occurrence of a plurality of errors (hard or soft errors) or when the number of errors exceeds a threshold.

Figure 4:
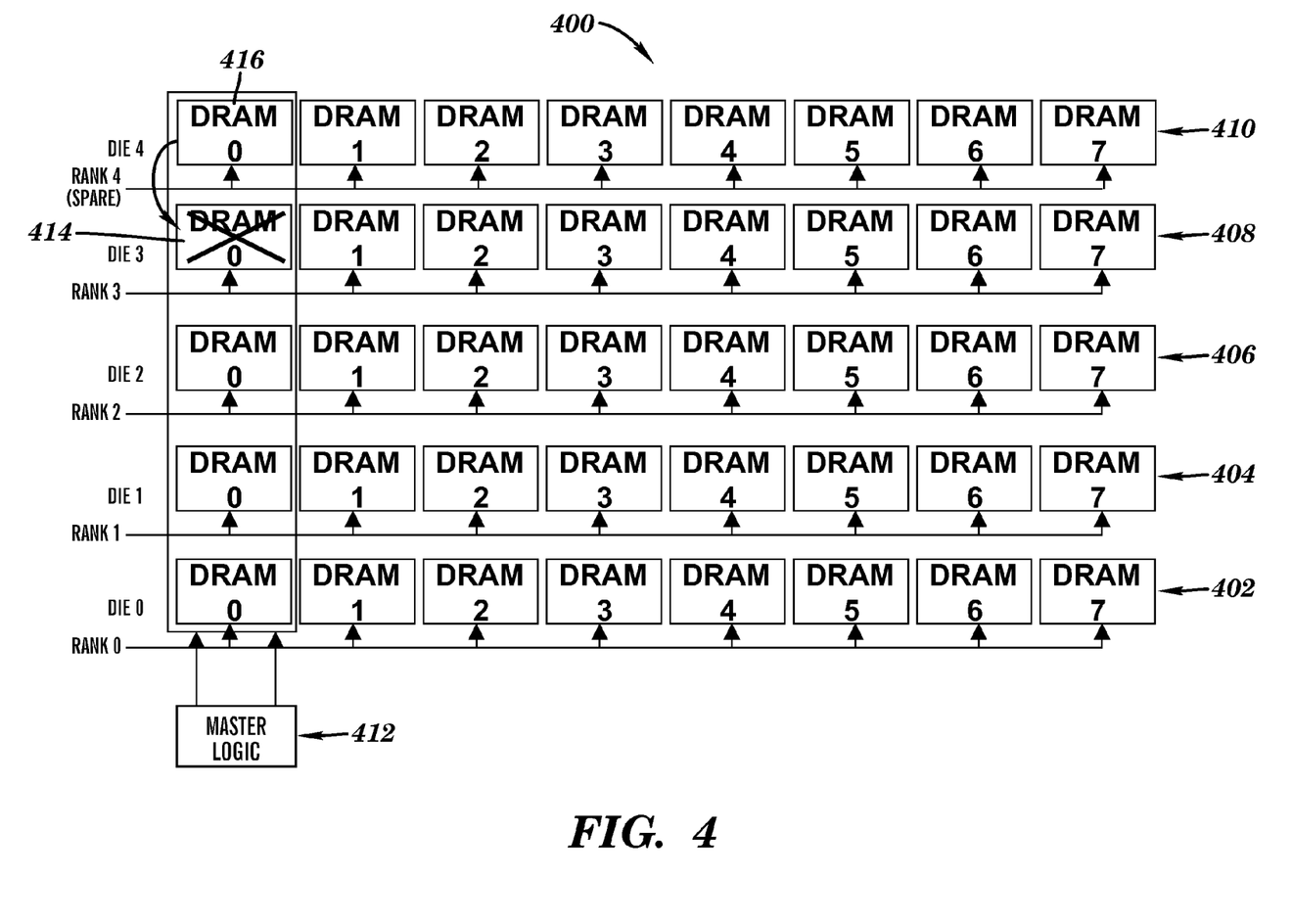
FIGS. 4-6 are block diagrams of exemplary 3D memory systems configured to perform a sparing operation in accordance with embodiments.

FIG. 4 is a block diagram of an exemplary 3D memory system or device 400 configured to perform an exemplary sparing operation. In an embodiment, the memory module 400 includes TSV DRAM having five dies stacked together where each die corresponds to a rank. As depicted, the bottom four dies have associated chip selects. Accordingly, rank 402 corresponds to die 0 (rank 1), 404 corresponds to die 1 (rank 2), rank 406 corresponds to die 2 (rank 3), rank 408 corresponds to die 3 (rank 4) and rank 410 corresponds to die 4 (spare rank). In an embodiment, the spare rank 410 does not have an associated chip select, as it is configured to be a spare during production of the memory device. Accordingly, ranks 402, 404, 406 and 408 each have associated chip selects to enable active use of the ranks during operation. In embodiments, a master chip 412 has in-built logic to perform memory mapping during memory system run-time (i.e., dynamic or run time sparing) or in manufacturing mode (i.e., when the module is being manufactured). Dynamic sparing occurs while the memory system remains powered up, thus providing an improved customer experience and reliability availability and serviceability (RAS) features. Accordingly, because of the logic in the master chip 412, the memory mapping is transparent to the memory controller and would enable the usage of a spare chip instead of the failed chip during run time or during system initialization. In an example, a first chip 414 (DRAM chip 0 of die 3) has a run time error or failure. The memory controller requests a spare chip inside the TSV DRAM stack through mode register commands, such as those commands described above. The master logic chip 412 responds affirmative that a second chip 416 is available (e.g., DRAM chip 0 of spare rank). In embodiments, the second chip 416 (along with the entire spare rank) is then powered up. Then mapping within the master logic chip 412 maps the second chip 416 to replace the first chip 414 and the memory controller is able to use the spare chip. After replacement of the first chip 414 by the second chip 416 using the mapping and mode register commands along with logic in the master logic chip 412, the first chip 414 is powered down to save power. Accordingly, after a failure in a first chip, a second chip in the same column as the first chip in the 3D memory module may replace the failed first chip by the depicted sparing method to provide improved memory performance.

Figure 5:
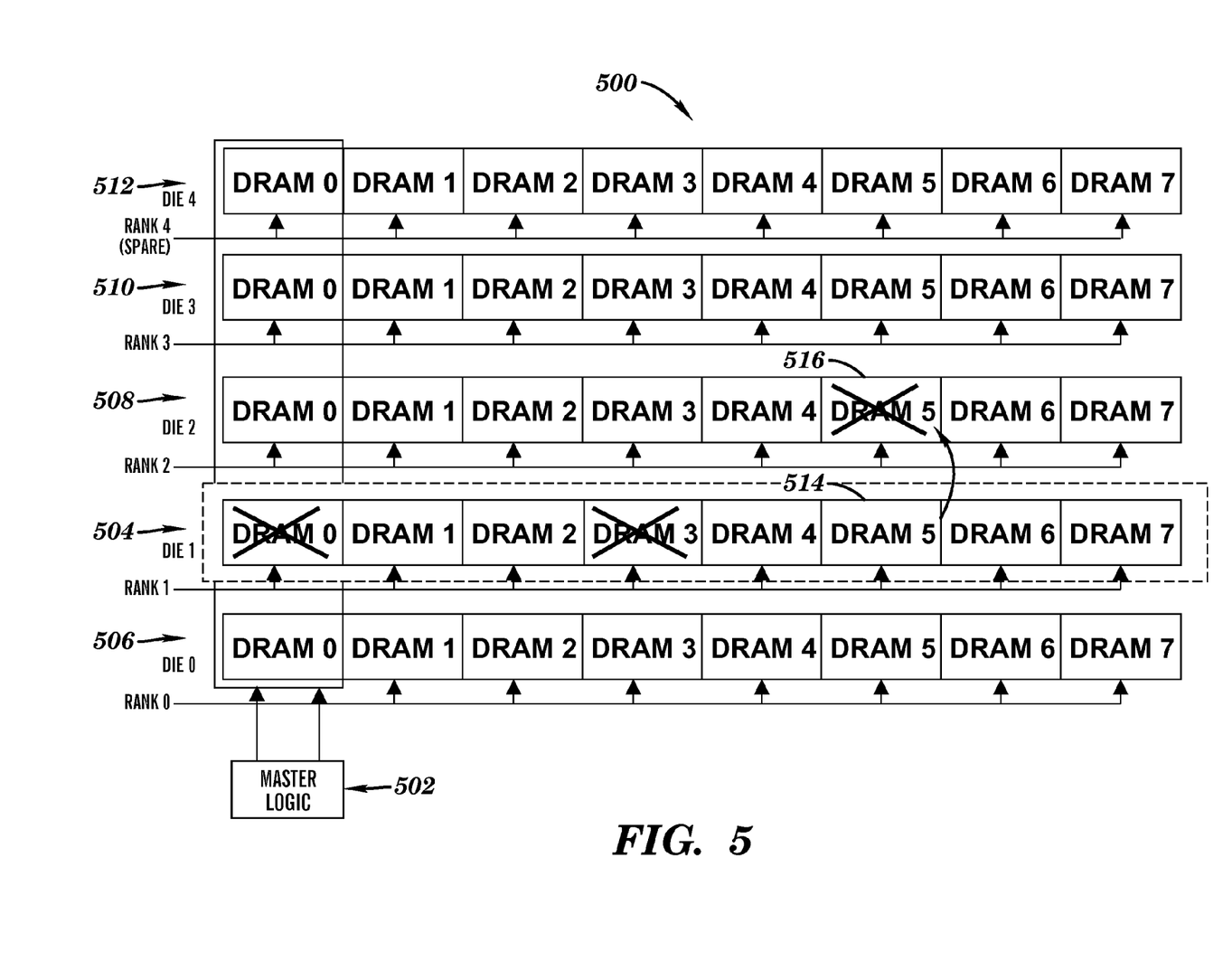

FIG. 5 is a block diagram of an exemplary 3D memory system or device 500 configured to perform an exemplary sparing operation. In an embodiment, the memory device 500 includes TSV DRAM having five dies stacked together where each die corresponds to a rank. As depicted, the bottom four dies have associated chip selects. A master logic chip 502 is configured to communicate and map communications with the dies. In an embodiment, rank 504 (rank "1"), experiences a plurality of failures and is taken offline or de-configured. DRAM chips 1, 2, 4, 5, 6 and 7 of rank 1 are all verified as properly working, and thus are enabled as spares for the rank 504, while chips 0 and 3 are not available as spares. The rank 504 is provided as a spare in addition to rank 512, which is designated as a spare during production. Accordingly, in the example, ranks 506, 508 and 510 remain active while ranks 504 and 512 are now spares. Further, chips 1, 2, 4, 5, 6 and 7 for both ranks 504 and 512 provide spares, while chips 0 and 3 only have spares in rank 512. In an example, when a chip 516 (DRAM chip 5) of rank 508 (rank "2") has an error, the memory controller requests to use a chip 514 (DRAM chip 5) of rank 504 (rank "1") instead of the failed chip by mapping the communications in the master logic chip 502. Accordingly, a spare chip in the same column as a failed chip may be mapped to replace the failed chip via MR commands and the master logic chip 502.

Figure 6:
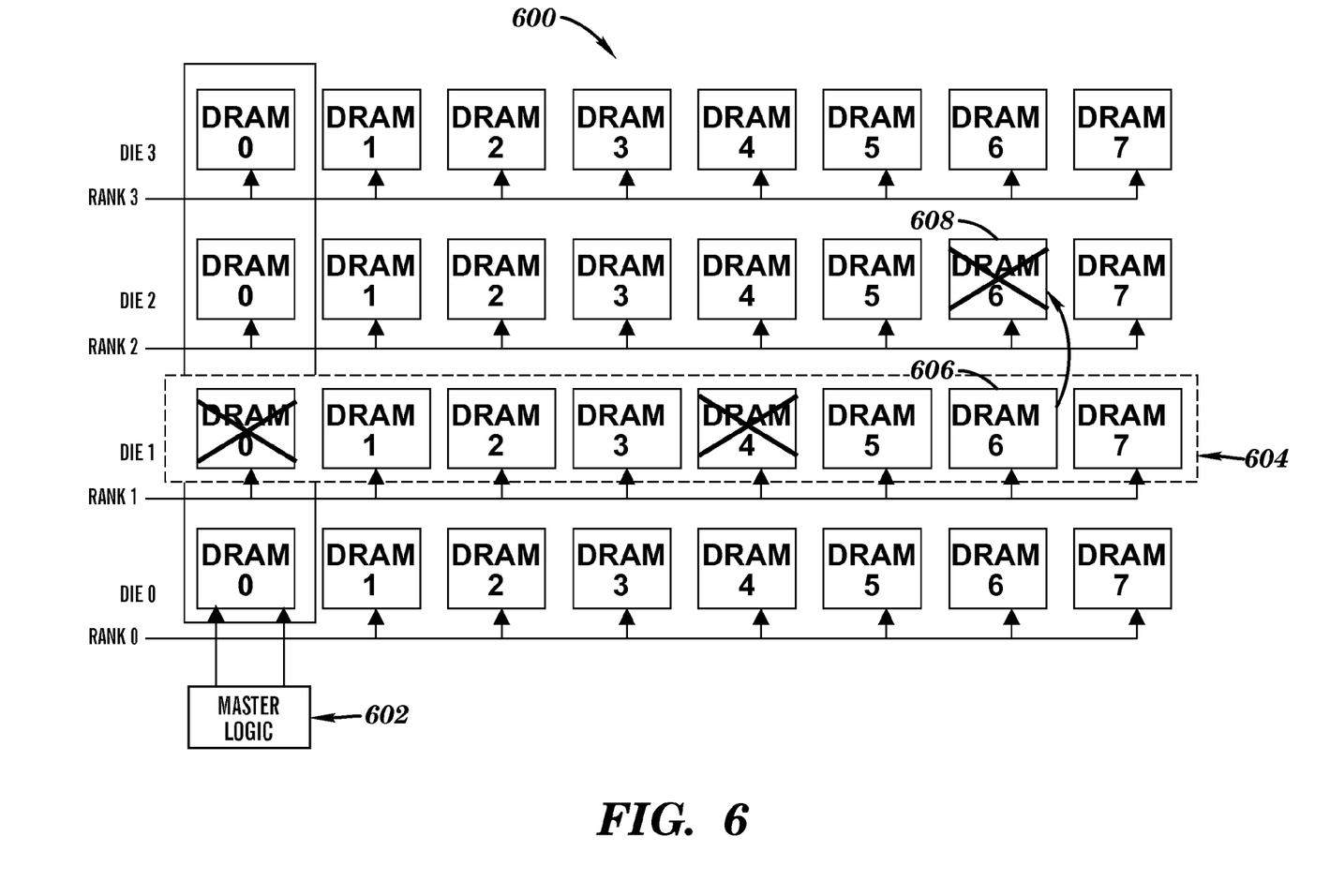

FIG. 6 is a block diagram of an exemplary 3D memory system or device 600 configured to perform an exemplary chip sparing operation. In an embodiment, the memory device 600 includes TSV DRAM having four dies stacked together where each die corresponds to a rank or chip select. A master logic chip 602 is configured to communicate and map communications with the dies. In the memory device 600, no ranks are initially configured as a spare rank and each rank has an associated chip select. In an embodiment, the memory controller requests a spare rank via a mode register command and a master logic chip 602 confirms there is no spare rank. A rank may be designated as a spare rank based on any suitable criteria, such as multiple errors within the rank. In a case where a rank 604 experiences a plurality of failures, the rank 604 is de-configured or taken offline, where the operational chips within the rank are used as spares. As depicted, DRAM chips 1, 2, 3, 5, 6 and 7 are used as spares while failed chips 0 and 4 are disabled from sparing. In an example, when a chip 608 (DRAM chip 6) of rank "2" has an error, the memory controller requests to use a chip 606 (DRAM chip 6 ) of rank "1" instead of the failed chip by mapping the communications in the master logic chip 602. Accordingly, the depicted arrangement effectively utilizes memory space inside the stack in case of failure and de-configuration of a single rank by using functional chips as spares within a de-configured rank.

In embodiments, sparing for failed chips in a 3D memory device may be provided by any suitable hardware and/or software implementation. In an embodiment, sparing logic can be an active circuit that is part of the master logic (e.g. master logic chip). The appropriate counters and other data is also part of the active circuit with no communication to the memory controller. In another embodiment, direct hardware implementation of the sparing logic is employed, where the logic is usable during power up. As compared to the MR commands above, the hardware implementation cannot be used during run time.

Technical effects include the ability to replace a failed chip with a spare chip in a spare die in the case of any UE (Unrecoverable Error) during run-time for TSV 3D memory devices. Further, the spare ranks may be used both during manufacturing and run-time. In the case of more than one chip failure in a rank, then the rank will be taken offline where good chips in that de-configured rank can be used as a spares going forward. Accordingly, the sparing method provides improved reliability and flexibility for memory systems.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for operating a three dimensional ("3D") memory device, the method comprising:
    detecting, by a memory controller, an error on the 3D memory device;
    correcting the detected error using an error control code;
    detecting, by the memory controller, a subsequent error in a first chip in a first rank of the 3D memory device;
    in response to the detection of the subsequent error, powering up a second chip in a second rank that is different than the first rank; and
    subsequent to the powering up, sending a command from the memory controller to the 3D memory device, that reassigns a chip select, initially assigned to the first chip, to the second chip.

2. The method of claim 1, wherein powering up the second chip in the second rank comprises powering up the second chip in a spare rank, wherein the second chip does not have an associated chip select that is addressable by the memory controller coupled to the 3D memory device.

3. The method of claim 1, wherein powering up the second chip in the second rank comprises powering up the second chip in the second rank, wherein errors cause the second rank to be de-configured.

4. The method of claim 1, wherein sending the command from the memory controller to the 3D memory device comprises sending one or more commands to set a mode register in a master chip of the 3D memory device to map communications directed to the first chip to target the second chip.

5. The method of claim 1, wherein sending a command from the memory controller to the 3D memory device comprises sending the command while the 3D memory device remains powered up to provide dynamic sparing.

6. The method of claim 1, comprising powering down the first chip after data is copied from the first chip to the second chip.

7. A computer program product for operating a three dimensional ("3D") memory device, the computer program product comprising:
    a tangible storage medium readable by a processing circuit and storing instructions for execution by the processing circuit for performing a method comprising:
        detecting a first error on the 3D memory device;
        detecting a second error in a first chip in a first rank of the 3D memory device,
        wherein the first chip has an associated first chip select that is addressable by a memory controller coupled to the 3D memory device;
        in response to the detection of the second error, powering up a second chip that does not have an assigned chip select that is addressable by the memory controller, the second chip located in a designated spare rank;
        sending a command from the memory controller to the 3D memory device to replace the first chip in the first rank with the second chip by reassigning the first chip select to the second chip; and
        correcting the first error using an error control code.

8. The computer program product of claim 7, wherein powering up the second chip in the second rank comprises powering up the second chip in the second rank, wherein errors cause the second rank to be de-configured.

9. The computer program product of claim 8, wherein the second chip is functioning while one or more other chips in the second rank are failed due to the errors.

10. The computer program product of claim 7, wherein sending the command from the memory controller to the 3D memory device comprises sending one or more commands to set a mode register in a master chip of the 3D memory device to map communications directed to the first chip to target the second chip.

11. The computer program product of claim 7, wherein sending a command from the memory controller to the 3D memory device comprises sending the command while the 3D memory device remains powered up to provide dynamic sparing.

12. The computer program product of claim 7, wherein sending the command from the memory controller to the 3D memory device comprises updating a table in a master chip in the 3D memory device to replace the first chip in the associated first chip select with the second chip.

13. A system for operating a memory system, the system comprising:
    a memory controller and a three dimensional ("3D") memory device, the system configured to perform a method comprising:
        detecting a first error on in the 3D memory device;
        detecting a second error in a first chip in a first rank of the 3D memory device, wherein the first chip has an associated first chip select;
        powering up a second chip in a second rank;
        sending a command from a memory controller to the 3D memory device to replace the first chip in the first chip select with the second chip; and
        correcting the first error using an error control code.

14. The system of claim 13, wherein powering up the second chip in the second rank comprises powering up the second chip in a spare rank, wherein the second chip does not have an assigned chip select before the power up.

15. The system of claim 13, wherein the second chip is functioning while one or more other chips in the second rank are failed due to the errors.

16. The system of claim 13, wherein sending the command from the memory controller to the 3D memory device comprises sending one or more commands to set a mode register in a master chip of the 3D memory device to map communications directed to the first chip to target the second chip.

17. The system of claim 13, wherein sending a command from the memory controller to the 3D memory device comprises sending the command while the 3D memory device remains powered up to provide dynamic sparing.

18. The method of claim 1, wherein the command sent to the 3D memory device results in updating a mapping table in a master chip of the 3D memory device such that communications directed to the first chip instead target the second chip.

19. The computer program product of claim 7, wherein the command sent to the 3D memory device includes a spare chip identifier and a target chip identifier, and wherein the command results in updating a mapping table in a master chip of the 3D memory device with the spare chip identifier and the target chip identifier such that communications directed to the first chip instead target the second chip.

20. The system of claim 13, wherein the command sent to the 3D memory device includes a spare chip identifier and a target chip identifier, and wherein the command results in updating a mapping table in a master chip of the 3D memory device with the spare chip identifier and the target chip identifier such that communications directed to the first chip instead target the second chip.

* * * * *